United States Patent
Wang et al.

(10) Patent No.: US 8,111,556 B2
(45) Date of Patent: Feb. 7, 2012

(54) NONVOLATILE MEMORY DEVICE AND METHOD OF OPERATING THE SAME

(75) Inventors: In Soo Wang, Chungcheongbuk-do (KR); Joong Seob Yang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 201 days.

(21) Appl. No.: 12/368,646

(22) Filed: Feb. 10, 2009

(65) Prior Publication Data

US 2009/0296465 A1    Dec. 3, 2009

(30) Foreign Application Priority Data

May 29, 2008   (KR) .................. 10-2008-0050104

(51) Int. Cl.
*G11C 11/34* (2006.01)

(52) U.S. Cl. ......... 365/185.22; 365/185.03; 365/185.14; 365/185.17; 365/185.18; 365/185.19; 365/185.2; 365/185.23; 365/185.24; 365/185.25; 365/189.16; 365/189.15; 365/189.07; 365/189.09; 365/203; 365/211

(58) Field of Classification Search ............. 365/185.03, 365/185.14, 185.17, 185.18, 185.19, 185.2, 365/185.23, 185.24, 185.25, 189.16, 189.15, 365/189.07, 189.09, 203, 211, 230.06
See application file for complete search history.

(56) References Cited

U.S. PATENT DOCUMENTS

| 2005/0169057 A1* | 8/2005 | Shibata et al. | 365/185.28 |
| 2008/0158378 A1* | 7/2008 | Lee | 348/222.1 |
| 2008/0158960 A1* | 7/2008 | Sekar et al. | 365/185.09 |
| 2008/0316814 A1* | 12/2008 | Haque et al. | 365/185.03 |

FOREIGN PATENT DOCUMENTS

KR    1020070080037 A    8/2007

* cited by examiner

*Primary Examiner* — Fernando N. Hidalgo
(74) *Attorney, Agent, or Firm* — IP & T Group LLP (57) ABSTRACT

A nonvolatile memory device and a method of operating the same. The nonvolatile memory device includes a memory cell array including memory cells for storing data, a temperature sensor and a controller. The temperature sensor outputs a temperature detection signal according to ambient temperatures while changing one or more pieces of reference voltage information, which are previously stored, when data is programmed into the memory cell array. The controller performs a verify operation of the program using a fast verify method and decides the number of steps which are comprised in step-shaped verify voltage pulse of the fast verify method according to the temperature detection signal.

15 Claims, 5 Drawing Sheets

NONVOLATILE MEMORY DEVICE AND METHOD OF OPERATING THE SAME

CROSS-REFERENCE TO RELATED APPLICATION

The present application claims priority from Korean patent application number 10-2008-0050104, filed on May 29, 2008, which is incorporated by reference in its entirety.

BACKGROUND OF THE INVENTION

The present invention relates to a method of operating a nonvolatile memory device and, more particularly, to a nonvolatile memory device and a method of operating the same, in which program verify times can be controlled according to ambient temperatures.

A flash memory device, being a nonvolatile memory device, generally includes a plurality of strings in each of which a plurality of memory cells is connected in series. Flash memory devices have been widely used for various semiconductor devices such as portable electronic devices, such as notebook computers, personal digital assistants (PDAs) and mobile phones, computer bios, printers, and universal serial bus (USB) drivers.

A memory cell array of a general flash memory device has a structure in which memory cells are connected in series between bit lines BL and a cell source line CSL. Further, a NAND flash memory device has two transistors, such as a drain select line DSL and a source select line SSL, connected thereto in order to electrically connect the memory cell to the bit line BL and the cell source line CSL.

In addition, nonvolatile memory devices have increasingly adopted products using a multi-level cell (MLC), which is able to store several bits of data in one memory cell, in order to extend the capacity of data that can be stored. The nonvolatile memory device adopting the MLC has an increased capacity since several bits of data can be stored in one memory cell. However, in this nonvolatile memory device, in the case in which one memory cell is programmed, a threshold voltage distribution is divided into several voltage distributions. Thus, the width of the threshold voltage distribution has to be narrowed through programming so as to reduce error at the time of data reading.

In order to reduce the width of the threshold voltage distribution, a variety of programming methods have been presented. One of the methods can include a method of performing a verify operation in several levels by subdividing a verify voltage with respect to one threshold voltage distribution.

However, to verify one threshold voltage distribution in several verify voltage levels is problematic in that the program time is increased. Accordingly, a fast verify method has been used which can shorten the program time while employing several verify voltage levels.

Figure 1:
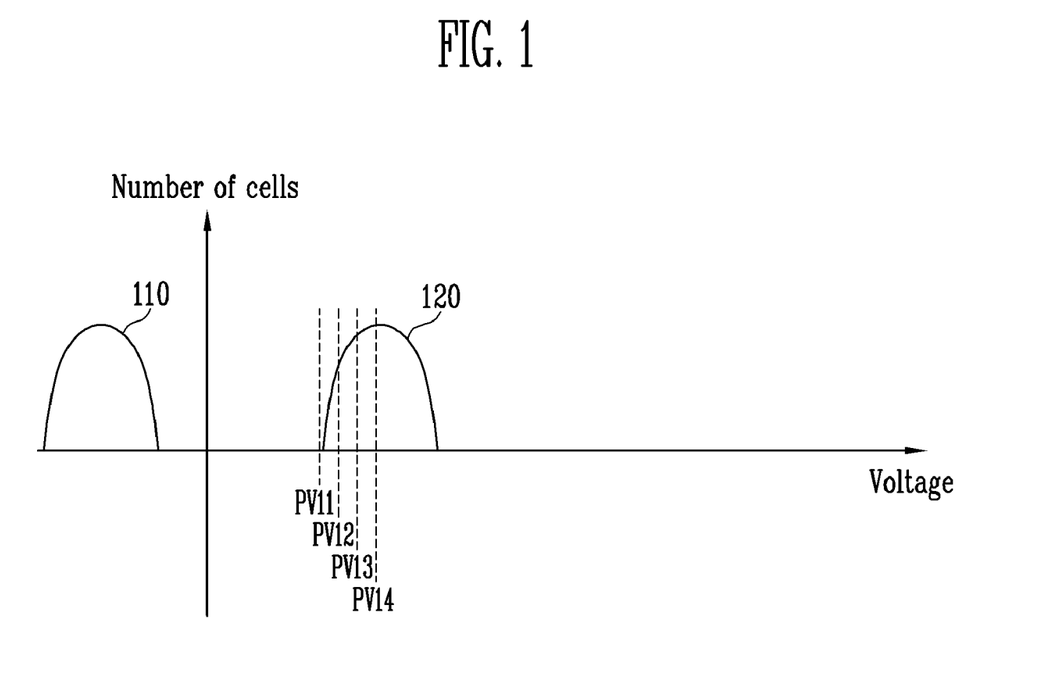
FIG. 1 is a diagram showing voltage levels for a fast verify method in threshold voltage distributions.

FIG. 1 is a diagram showing voltage levels for the fast verify method in threshold voltage distributions.

Referring to FIG. 1, if it is sought to include memory cells of a first threshold voltage distribution 110, including erase cells, in a second threshold voltage distribution 120 through programming, four verify voltage levels PV11 to PV14 are used.

Here, the fast verify method is used. The fast verify method is a method of precharging a bit line only once and then performing a verify operation while sequentially changing a verify voltage. In other words, after the bit line is precharged only once, the four verify voltages PV11 to PV14 are sequentially applied to a selected word line.

If the fast verify method is used as described above, a verify operation with several levels can be performed on one threshold voltage distribution. Consequently, the verify time can be shortened while narrowing the width of the threshold voltage distribution.

However, the fast verify method may become problematic when there is a lot of the leakage current in a bit line. The leakage current of a bit line increases when temperature rises according to the characteristics of a nonvolatile memory device. Due to this, even though a cell is in a pass state, the cell can be recognized as a failure since a bit line voltage is lowered due to the leakage current. In this case, an over program can be performed since the program is continuously performed.

BRIEF SUMMARY OF THE INVENTION

The present invention is directed towards a nonvolatile memory device and a method of operating the same, in which the number of changing a verify voltage can be limited according to ambient temperatures when the fast verify method is carried out.

A nonvolatile memory device according to an aspect of the present invention includes a memory cell array including memory cells for storing data, a temperature sensor and a controller. The temperature sensor outputs a temperature detection signal according to ambient temperatures while changing one or more pieces of reference voltage information, which are previously stored, when data is programmed into the memory cell array. The controller performs a verify operation of the program using a fast verify method and decides the number of steps which are comprised in step-shaped verify voltage pulse of the fast verify method according to the temperature detection signal.

The temperature sensor includes a storage unit storing reference voltage information, which is changed according to temperature, voltage generating means for outputting a changed voltage according to a present temperature, and a temperature detector for comparing the voltage output from the voltage generating means and the reference voltage stored in the storage unit and outputting the temperature detection signal according to the comparison result.

The storage unit stores voltage level information output from the voltage generating means according to first to $n^{th}$ temperature information.

The temperature detector includes a reference voltage level, which is stored in the storage unit, with a voltage, which is output from the voltage generating means according to a present temperature, while changing the reference voltage level, and, if, as a result of the comparison, the voltage output from the voltage generating means is higher than the reference voltage level stored in the storage unit, outputs the temperature detection signal of a high level.

The temperature sensor compares a reference voltage, being with respect to a high temperature, with a voltage, which is output from the voltage generating means according to a present temperature, by sequentially changing the reference voltage from the reference voltage with respect to the high temperature whenever the verify voltage level of the fast verify method is changed, and outputs the temperature detection signal according to the comparison result.

When the temperature detection signal output from the temperature sensor is a high level, the controller finishes the program.

A method of operating a nonvolatile memory device according to another aspect of the present invention includes performing a program, precharging a bit line, and then performing a first verify operation employing a first verify voltage; if the first verify operation has not passed, checking a temperature detection signal in accordance with a comparison result of a comparison voltage according to a present temperature and a reference voltage with respect to a first temperature; if, as a result of the check, the temperature detection signal is a first logic level, performing a second verify operation employing a second verify voltage higher than the first verify voltage; if the second verify operation has not passed, checking a temperature detection signal in accordance with a comparison result of the comparison voltage and a reference voltage with respect to a second temperature; and if, as a result of the check, the temperature detection signal is the first logic level, performing a third verify operation employing a third verify voltage higher than the second verify voltage.

The first temperature is higher than the second temperature.

The first to third verify operations are performed using a fast verify method of performing the second verify operation and the third verify operation without performing discharging and precharging of a bit line after the first verify operation.

When the temperature detection signal with respect to the first temperature is a second logic level, the program is finished.

When the temperature detection signal with respect to the second temperature is a second logic level, the program is finished.

If the first verify operation has passed, the program is performed again by raising a program voltage, wherein the program is performed beginning with the second verify operation.

If the second verify operation has passed, the program is performed again by raising a program voltage, wherein the program is performed beginning with the third verify operation.

If the third verify operation has not passed, the program is performed again by raising a program voltage.

DESCRIPTION OF SPECIFIC EMBODIMENT

Now, a specific embodiment according to the present invention will be described with reference to the accompanying drawings. However, the present invention is not limited to the disclosed embodiment, but may be implemented in various ways. The embodiment is provided to complete the disclosure of the present invention and to allow those having ordinary skill in the art to understand the scope of the present invention. The present invention is defined by the claims.

Figure 2:
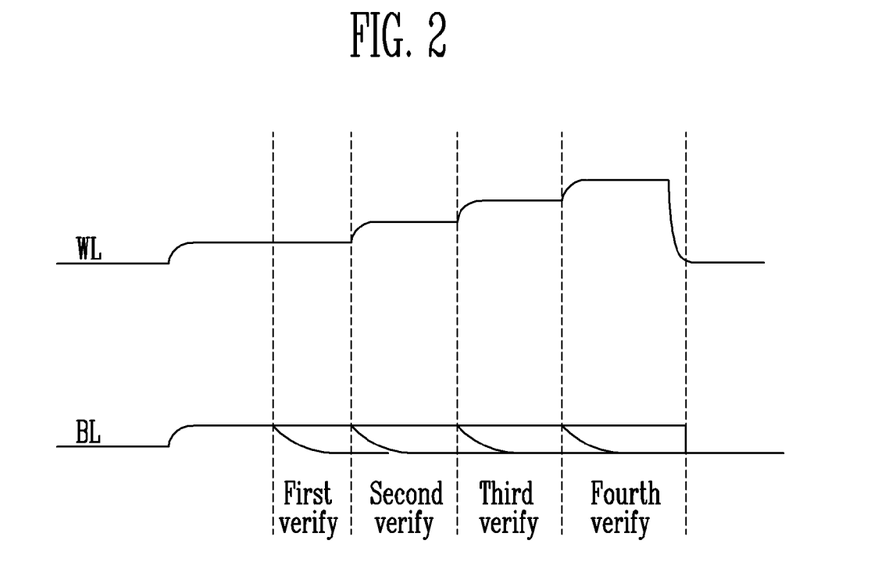
FIG. 2 is a diagram showing word line and bit line voltages when the fast verify method is performed.

FIG. 2 is a diagram showing word line and bit line voltages when the fast verify method is performed.

Referring to FIG. 2, when first to fourth verify operations are performed on one threshold voltage distribution, first to fourth verify voltages PV1 to PV4 are sequentially applied to a word line WL in the state where a bit line is precharged only once.

If the bit line is discharged when the first verify voltage is applied to the word line, it is meant that programming has not passed with respect to the lowest first verify voltage. Thus, the programming proceeds without performing subsequent verify operations.

However, if the bit line is in a precharge state when the first verify voltage is applied to the word line, it is determined that a first verify operation has passed, and a word line voltage changes to a second verify voltage level.

As described above, in the fast verify operation for performing verify operations using the first to fourth verify voltages, the first to fourth verify voltage levels are controlled according to ambient temperatures.

In this case, the leakage current of the bit line increases as temperature rises. Thus, there is a case where, even though a verify operation has not passed actually, the bit line is discharged. Consequently, a verify operation is determined to have passed and the verify voltage level is therefore controlled.

Figure 3A:
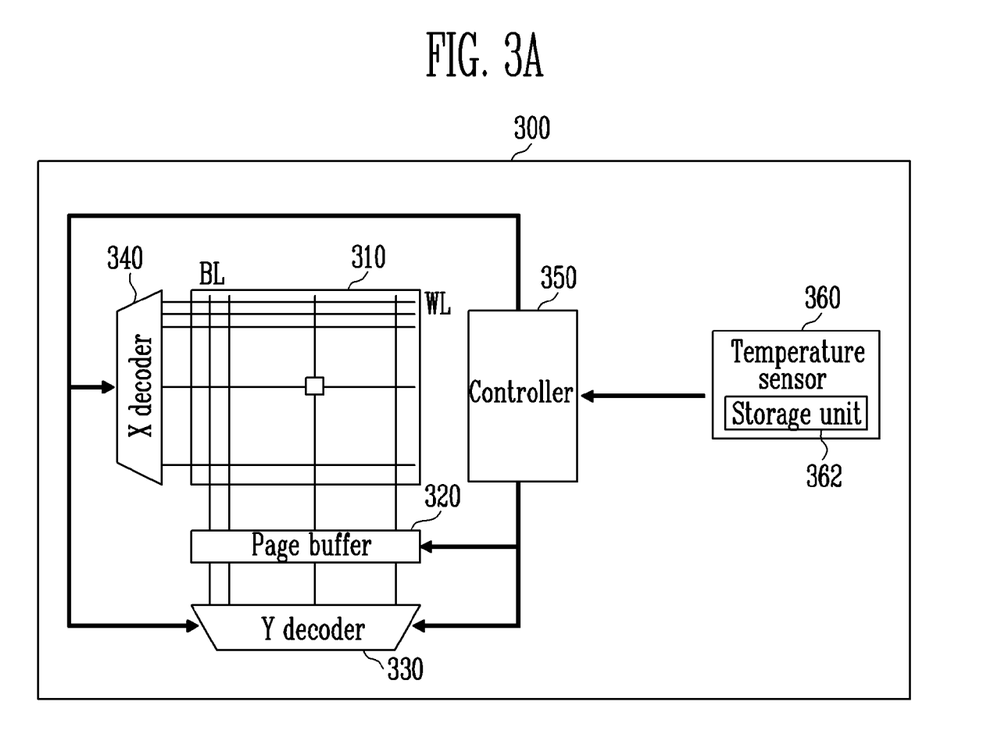
FIG. 3A is a block diagram of a nonvolatile memory device in accordance with an embodiment of the present invention.

FIG. 3A is a block diagram of a nonvolatile memory device in accordance with an embodiment of the present invention.

Referring to FIG. 3A, a nonvolatile memory device 300 includes a memory cell array 310, a page buffer 320, a Y decoder 330, an X decoder 340, a controller 350 and a temperature sensor 360.

The memory cell array 310 includes memory cells for storing data storage. The memory cells are connected by word lines and bit lines. The page buffer 320 includes a plurality of page buffer circuits for latching data, which will be stored in a memory cell coupled to a bit line and then selected, or reading data stored in a memory cell and temporarily storing the read data.

The Y decoder 330 provides a path for a data input/output to the page buffer circuits of the page buffer 320. The X decoder 340 selects and connects a word line of the memory cell array 310.

The temperature sensor 360 outputs a temperature detection signal TDS based on a reference voltage differently input according to ambient temperatures. The controller 350 controls a verify number according to the temperature detection signal TDS. The controller 350 controls a verify number. The temperature sensor 360 includes a storage unit 362 for storing reference voltage information according to temperature.

The controller 350 controls a program or data read operation. The controller 350 uses a fast programming method as a program verify operation and, when verify pass is unsuccessful, performs programming again or finishes the programming according to whether the temperature detection signal TDS is input. The controller 350 decides the number of steps which are comprised in step-shaped verify voltage pulse of the fast verify method according to the temperature detection signal.

The temperature sensor 360 is configured as follows.

Figure 3B:
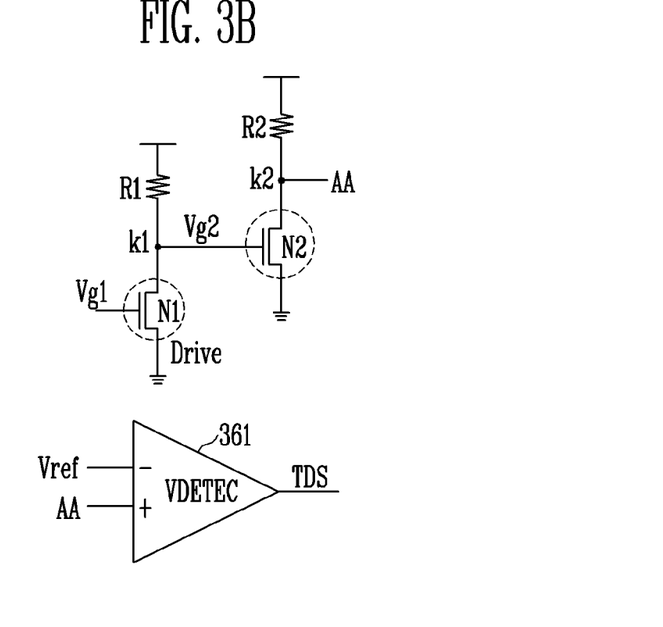
FIG. 3B is a circuit diagram of a temperature sensor.

FIG. 3B is a circuit diagram of the temperature sensor.

Referring to FIG. 3B, the temperature sensor 360 includes first and second resistors R1, R2, first and second NMOS transistors N1, N2, and a temperature detector 361. The first resistor R1 and the first NMOS transistor N1 generate a second voltage Vg2. The second resistor R2 and the second NMOS transistor N2 operate according to the second voltage Vg2 and output a comparison voltage AA for confirming temperature.

The first resistor R1 and the first NMOS transistor N1 are connected in series between a power supply voltage and a ground node. The second voltage Vg2 is generated at a node K1, that is, a contact of the first resistor R1 and the first NMOS transistor N1. A first voltage Vg1 is applied to the gate of the first NMOS transistor N1. The first voltage Vg1 is a voltage that is able to turn on the first NMOS transistor N1 in order to confirm temperature.

The second resistor R2 and the second NMOS transistor N2 are also connected in series between the power supply voltage and the ground node. The second voltage Vg2 of the node K1 is input to the gate of the second NMOS transistor N2.

Further, the comparison voltage AA is output through a node K2, that is, a contact of the second resistor R2 and the second NMOS transistor N2.

The temperature detector 361 compares a reference voltage Vref and the comparison voltage AA and outputs the temperature detection signal TDS according to temperature. The reference voltage Vref can have a different value according to ambient temperatures.

That is, a reference voltage value with respect to a temperature at which a verify number should be controlled according to a degree in which the threshold voltage of a memory cell is changed according to a temperature is stored in the storage unit 362. The reference voltage value is compared with the comparison voltage AA, which is changed according to the present temperature, while sequentially changing the reference voltage value in order to confirm the present temperature.

More particularly, reference voltages when an ambient temperatures is 90 degrees Celsius or higher, 90 degrees Celsius or less to 60 degrees Celsius or higher, 60 degrees Celsius or less to 40 degrees Celsius or higher, and 40 degrees Celsius or less are previously stored in the storage unit 362. The respective reference voltages are sequentially input to the temperature detector 361 in order to determine whether the temperature detection signal TDS is output.

Figure 3C:
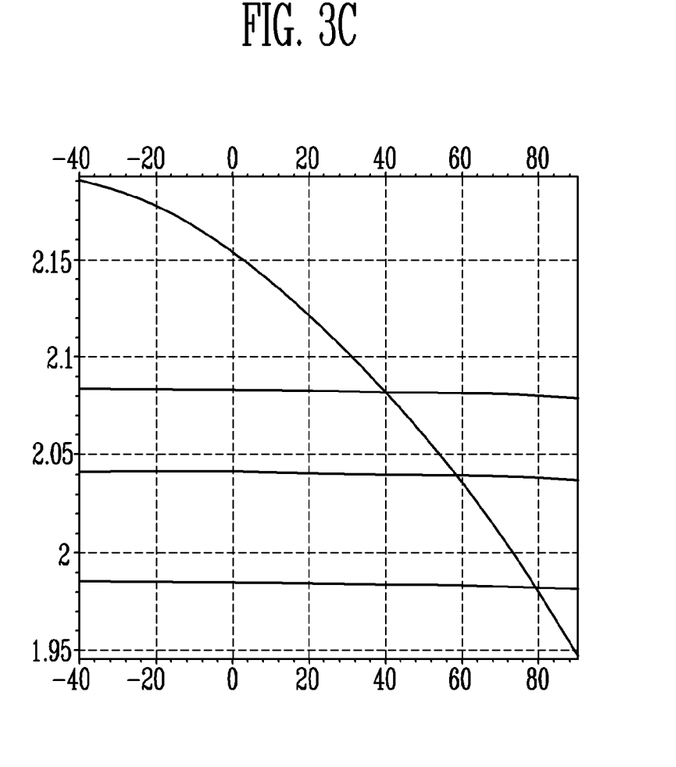
FIG. 3C is a graph showing a reference voltage level changed according to temperatures.

The reference voltages for detecting temperature can be stored by employing test data as shown in FIG. 3C.

FIG. 3C is a graph showing a reference voltage level changed according to temperatures.

FIG. 3C illustrates data that was obtained by performing experiments on reference voltages changed according to temperatures.

Reference voltage levels as listed in the following table (refer to FIG. 3C) are stored in the storage unit 362 of the temperature sensor 360.

TABLE 1

| Temperature (t) | Reference voltage |
|---|---|
| 80 degrees Celsius | 1.985 |
| 60 degrees Celsius | 2.04 |
| 40 degrees Celsius | 2.085 |
| 0 degrees Celsius | 2.155 |

In the case in which the reference voltages according to the respective temperatures, as listed in Table 1, are input to an inverting terminal (−) of the temperature detector 361 and the comparison voltage AA changed according to the present temperature is input to a non-inverting terminal (+) of the temperature detector 361, the temperature detection signal TDS can be applied as a high level or a low level according to the amount of the two voltages.

For example, when a temperature is 50 degrees Celsius, the comparison voltage AA can become about 2.06V according to FIG. 3C. Thus, the comparison voltage AA of 2.06V is lower than the reference voltage 2.15V when the temperature is 0 degrees Celsius and 2.085V when the temperature is 40 degrees Celsius. Here, the reference voltage Vref input to the inverting terminal (−) of the temperature detector 361 is higher, so the temperature detector 361 outputs the temperature detection signal TDS of a low level.

Further, the reference voltage Vref of 2.04V when the temperature is 60 degrees Celsius is higher than the comparison voltage AA input to the non-inverting terminal (+), so that the temperature detector 361 outputs the temperature detection signal TDS of a high level. Thus, it can be seen that the present temperature is higher than 40 degrees Celsius, but lower than 60 degrees Celsius through the temperature detection signal TDS.

Figure 3D:
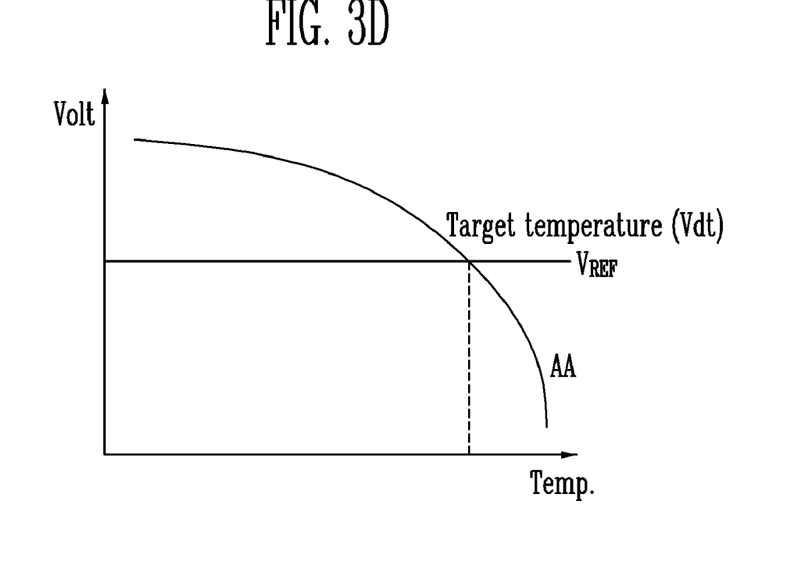
FIG. 3D is a graph showing a correlation between a threshold voltage and a temperature.

FIG. 3D is a graph showing a correlation between a threshold voltage and a temperature.

Referring to FIG. 3D, there is shown a correlation between temperature and a voltage Vdt at a target temperature, which is expected as a result of comparison between the comparison voltage AA and the reference voltage Vref. When the comparison voltage AA is lower than the reference voltage Vref, the temperature detection signal TDS is a low level and, when the comparison voltage AA is higher than the reference voltage Vref, the temperature detection signal TDS is a high level.

A verify number controlled according to temperature is as follows.

TABLE 2

| Temperature (t) | Verify Number |
|---|---|
| t ≧ 80 degrees Celsius | 1 |
| 80 degrees Celsius > t ≧ 60 degrees Celsius | 2 |
| 60 degrees Celsius > t ≧ 40 degrees Celsius | 3 |
| 40 degrees Celsius > t | 4 |

As listed in Table 2, as the temperature rises, levels in which the first to fourth verify operations are performed are controlled. For example, in the temperature range of 80 degrees Celsius or less to 60 degrees Celsius or higher, only up to the second verify operation is performed.

If the second voltage Vg2 is properly generated in the temperature sensor 360, the second NMOS transistor N2 operates in the subthreshold area and has a similar characteristic as that of the bipolar junction transistor (BJT). This makes the saturation current to increase exponentially with respect to temperature, and results thereof are shown in FIG. 3E through simulations.

Figure 3E:
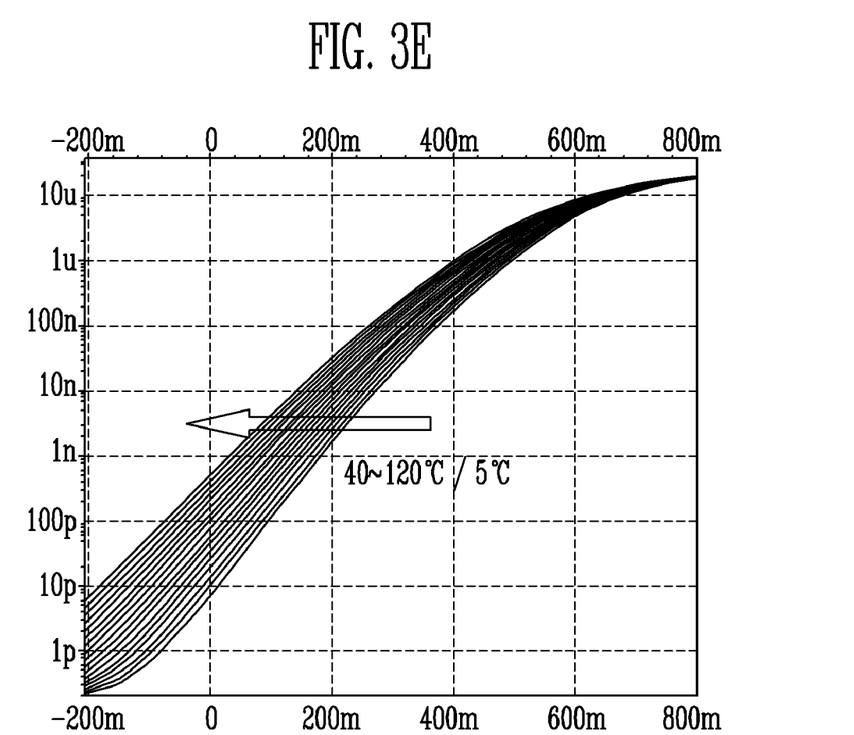
FIG. 3E shows simulation results of the temperature sensor shown in FIG. 3B.

FIG. 3E shows simulation results of the temperature sensor shown in FIG. 3B.

There are shown in FIG. 3E the operation results of the second NMOS transistor N2 operating in the subthreshold area.

A method of performing programming by changing the verify number according to temperature as described above is described below.

Figure 4:
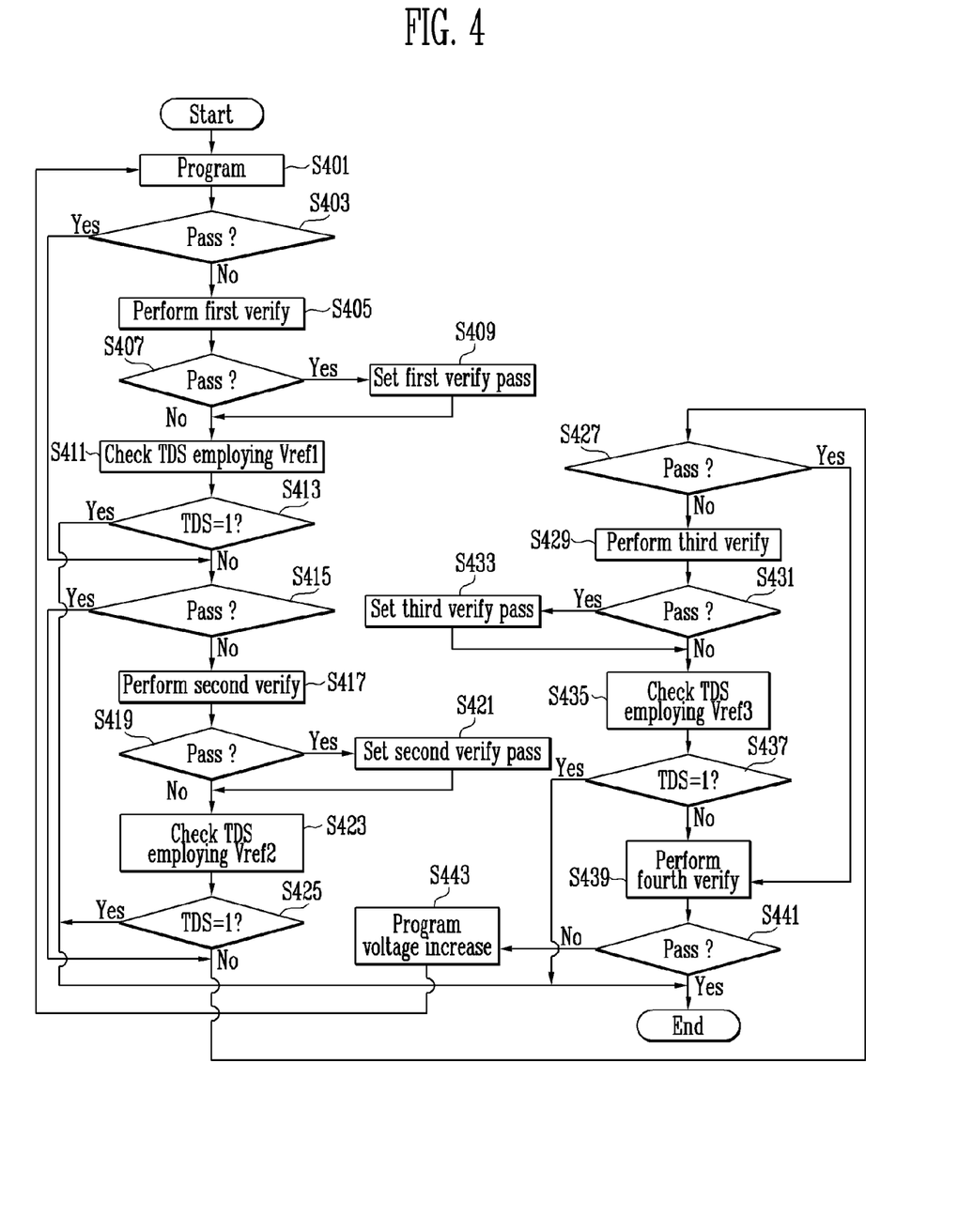
FIG. 4 is a flowchart illustrating a program operation in accordance with an embodiment of the present invention.

FIG. 4 is a flowchart illustrating a program operation in accordance with an embodiment of the present invention.

Referring to FIG. 4, after the nonvolatile memory device 100 performs programming in step S401, it is determined whether a first verify pass has been set in step S403. Here, for the purpose of the programming, a program command, address information of a memory cell to be programmed, and data to be programmed into the memory cell are received, and a program voltage is applied to a selected word line.

The reason why it is determined whether the first verify pass has been set after the programming is to exclude a first verify operation in subsequent operations since it is no longer to perform a pass verify operation if the first verify operation using the first verify voltage PV1 has passed even once.

If, as a result of the determination in step S403, the first verify pass has not been set, the first verify operation using the first verify voltage PV1 is carried out in step S405. Here, the first verify operation includes a process of sensing whether a bit line voltage has been changed by precharging a selected bit line, and applying the first verify voltage PV1 to a selected word line and a pass voltage to the remaining word lines.

If the bit line voltage has been discharged, it is meant that programming has not passed with respect to the first verify voltage PV1. Further, if the bit line voltage is in a precharge state, it is meant that programming has passed with respect to the first verify voltage PV1. If it is determined that the first verify operation has passed in step 407, the first verify pass is set in step 409. Next, the temperature detection signal TDS is checked by employing a first reference voltage Vref1 in step S411.

Further, even when the first verify operation has not passed in step 407, the temperature detection signal TDS is checked by employing the first reference voltage Vref1. Here, the first reference voltage Vref1 indicates a reference voltage when a temperature is 80 degrees Celsius.

The controller 350 determines whether the checked temperature detection signal TDS is a high level in step S413. If, as a result of the determination, the temperature detection signal TDS has a high level (that is, a value '1'), the controller 350 determines that the present temperature is 80 degrees Celsius or higher and thus finishes the program operation. This is because, as listed in Table 2, the controller 350 is set to perform only the first verify operation when the temperature is 80 degrees Celsius or higher.

If, as a result of the determination in step 413, the temperature detection signal TDS with respect to the first reference voltage Vref1 when the present temperature is 80 degrees Celsius is not the value '1', it is meant that the present temperature is lower than 80 degrees Celsius and, therefore, the controller 350 determines whether a second verify pass has been set in step S415.

If, as a result of the determination in step 415, the second verify pass has not been set, the controller 350 performs a second verify operation using the second verify voltage PV2 in step S417. That is, since the bit line voltage keeps a high level after the first verify operation is carried out, the controller 350 changes the voltage of the selected word line to the second verify voltage PV2 and then checks whether the bit line voltage has been changed again.

Next, if it is determined that the second verify operation has passed in step S419, the controller 350 sets the second verify pass in step S421 and then checks the temperature detection signal TDS by employing a second reference voltage Vref2 in step S423.

Further, even when the second verify operation has not passed in step S419, the controller 350 checks the temperature detection signal TDS by employing the second reference voltage Vref2. Here, the second reference voltage Vref2 indicates a reference voltage when the temperature is 60 degrees Celsius.

The controller 350 then determines whether the temperature detection signal TDS is '1' in step S425. Here, what the temperature detection signal TDS is '1' is meant that the present temperature is lower than 80 degrees Celsius, but higher than 60 degrees Celsius. Here, according to Table 2, when the temperature ranges from 80 degrees Celsius or less to 60 degrees Celsius or higher, the controller 350 is set to perform a verify operation up to the second verify operation.

Accordingly, the controller 350 finishes the program operation. If, as a result of the determination in step S425, the temperature detection signal TDS is not '1', it is meant that the present temperature is lower than 60 degrees Celsius. When the temperature is lower than 60 degrees Celsius, the controller 350 is set to perform a verify operation up to the third verify operation. Therefore, it is meant that a verify operation using the third verify voltage PV3 can be carried out.

Thus, the controller 350 determines whether the third verify pass has been set in step S427. If, as a result of the determination in step S427, the third verify pass has not been set, the controller 350 performs a third verify operation using the third verify voltage PV3 in step S429.

If it is determined that the third verify operation has passed in step S431, the controller 350 sets a third verify pass in step S433 and then checks the temperature detection signal TDS by employing a third reference voltage Vref3 in step S435. Even when the third verify operation has not passed in step S431, the controller 350 checks the temperature detection signal TDS by employing the third reference voltage Vref3. The third voltage Vref3 indicates a reference voltage when the temperature is 40 degrees Celsius.

Thereafter, if it is determined that the temperature detection signal TDS is '1' in step S437, it is meant that the present temperature is lower than 60 degrees Celsius, but higher than 40 degrees Celsius. Thus, the controller 350 does not perform a further verify operation after the third verify operation.

However, if, as a result of the determination in step S437, the temperature detection signal TDS is not '1', it is meant that the present temperature is lower than 40 degrees Celsius and, therefore, the controller 350 performs a fourth verify operation in step S439.

If it is determined that the fourth verify operation has passed in step S441, the program operation is finished. However, if, as a result of the determination in step S441, the fourth verify operation has not passed, the controller 350 increases the program voltage in step S443 and then performs the program operation.

As described above, a fast verify step is controlled according to the present temperature. Therefore, a program operation employing the fast verify method can be performed effectively. Further, the above description is focused on the fast verify method with respect to one threshold voltage distribution. Here, in the case in which a memory cell with several threshold voltages is programmed, the fast verify method can be performed every threshold voltage distribution.

As mentioned earlier, in accordance with the nonvolatile memory device and the method of operating the same according to the present invention, the number of changing a verify voltage level for the fast verify method is controlled according to ambient temperatures. Accordingly, the verify time can be shortened efficiently and the program operation time can be reduced.

The embodiment disclosed herein has been proposed to allow a person skilled in the art to easily implement the present invention, and the person skilled in the part may implement the present invention in various ways. Therefore, the scope of the present invention is not limited by or to the embodiment as described above, and should be construed to be defined only by the appended claims and their equivalents.

What is claimed is:

1. A nonvolatile memory device, comprising:
a memory cell array including memory cells to store data;
a temperature sensor configured to output a temperature detection signal when data is programmed into the memory cell array; and
a controller configured to perform a verify operation of the data that has been programmed into the memory cell array using a fast verify method by applying first to $K^{th}$ verify voltages sequentially, after precharging a selected bit line, wherein $1 \leq K \leq M$ and K varies according to the temperature detection signal, M is the maximum number of verification voltages, and K and M are natural numbers.

2. The nonvolatile memory device of claim 1, wherein the temperature sensor comprises:
a storage unit to store reference voltage information, which is changed according to temperature;
a voltage generator configured to output a changed voltage according to a present temperature; and
a temperature detector configured to compare the voltage output from the voltage generating means and the reference voltage stored in the storage unit and outputting the temperature detection signal according to the comparison result.

3. The nonvolatile memory device of claim 2, wherein the storage unit stores voltage level information output from the voltage generating means according to first to $n^{th}$ temperature information.

4. The nonvolatile memory device of claim 2, wherein the temperature detector compares a reference voltage level, which is stored in the storage unit, with a voltage, which is output from the voltage generating means according to a present temperature, while changing the reference voltage level, and, if, as a result of the comparison, the voltage output from the voltage generating means is higher than the reference voltage level stored in the storage unit, outputs the temperature detection signal of a high level.

5. The nonvolatile memory device of claim 4, wherein the temperature sensor compares a reference voltage, being with respect to a high temperature, with a voltage, which is output from the voltage generating means according to a present temperature, by sequentially changing the reference voltage from the reference voltage with respect to the high temperature whenever the verify voltage level of the fast verify method is changed, and outputs the temperature detection signal according to the comparison result.

6. The nonvolatile memory device of claim 1, wherein, when the temperature detection signal output from the temperature sensor is a high level, the controller finishes performing the verify operation.

7. The nonvolatile memory device of claim 1, wherein the temperature sensor configures to output the temperature detection signal according to ambient temperatures while changing one or more pieces of reference voltage information, which are previously stored.

8. A method of operating a nonvolatile memory device, comprising:
performing a program, precharging a bit line, and then performing a first verify operation employing a first verify voltage;
if the first verify operation has not passed, checking a temperature detection signal in accordance with a comparison result of a comparison voltage according to a present temperature and a reference voltage with respect to a first temperature;
if, as a result of the check, the temperature detection signal is a first logic level, performing a second verify operation employing a second verify voltage higher than the first verify voltage;
if the second verify operation has not passed, checking a temperature detection signal in accordance with a comparison result of the comparison voltage and a reference voltage with respect to a second temperature; and
if, as a result of the check, the temperature detection signal is the first logic level, performing a third verify operation employing a third verify voltage higher than the second verify voltage.

9. The method of claim 8, wherein the first temperature is higher than the second temperature.

10. The method of claim 8, wherein the first to third verify operations are performed using a fast verify method of performing the second verify operation and the third verify operation without performing discharging and precharging of a bit line after the first verify operation.

11. The method of claim 8, wherein, when the temperature detection signal with respect to the first temperature is a second logic level, the program is finished.

12. The method of claim 8, wherein, when the temperature detection signal with respect to the second temperature is a second logic level, the program is finished.

13. The method of claim 8, wherein, if the first verify operation has passed, the program is performed again by raising a program voltage, wherein the program is performed beginning with the second verify operation.

14. The method of claim 8, wherein, if the second verify operation has passed, the program is performed again by raising a program voltage, wherein the program is performed beginning with the third verify operation.

15. The method of claim 8, wherein, if the third verify operation has not passed, the program is performed again by raising a program voltage.

* * * * *